US00RE46315E

(19) United States
(12) Reissued Patent
Zwieback et al.

(10) Patent Number: US RE46,315 E
(45) Date of Reissued Patent: Feb. 21, 2017

(54) LARGE DIAMETER, HIGH QUALITY SIC SINGLE CRYSTALS, METHOD AND APPARATUS

(71) Applicant: II-VI Incorporated, Saxonburg, PA (US)

(72) Inventors: Ilya Zwieback, Township of Washington, NJ (US); Thomas E. Anderson, Morristown, NJ (US); Andrew E. Souzis, Hawthorne, NJ (US); Gary E. Ruland, Morris Plains, NJ (US); Avinash K. Gupta, Basking Ridge, NJ (US); Varatharajan Rengarajan, Flanders, NJ (US); Ping Wu, Warren, NJ (US); Xueping Xu, Westport, CT (US)

(73) Assignee: II-VI Incorporated, Saxonburg, PA (US)

(21) Appl. No.: 14/506,963

(22) Filed: Oct. 6, 2014

Related U.S. Patent Documents

Reissue of:
(64) Patent No.: 8,741,413
Issued: Jun. 3, 2014
Appl. No.: 13/867,198
Filed: Apr. 22, 2013

U.S. Applications:
(60) Provisional application No. 61/635,998, filed on Apr. 20, 2012.

(51) Int. Cl.
*B32B 3/00* (2006.01)
*C30B 11/14* (2006.01)
(Continued)

(52) U.S. Cl.
CPC ..... *C30B 29/36* (2013.01); *B28D 5/00* (2013.01); *C30B 23/005* (2013.01); *Y10T 428/21* (2015.01)

(58) Field of Classification Search
CPC ..... C30B 23/005; C30B 29/36; B28D 5/00; Y10T 428/21
See application file for complete search history.

(56) References Cited

U.S. PATENT DOCUMENTS 5,611,955 A 3/1997 Barrett et al.
5,707,446 A 1/1998 Volkl et al.
(Continued)

FOREIGN PATENT DOCUMENTS

EP 1233085 A1 8/2002
JP 2011132088 A 7/2011
(Continued)

OTHER PUBLICATIONS

Gupta et al, "Growth of Large Diameter 6H SI and 4H n+ SiC Single Crystals," Mater. Res. Soc. Symp. Proc., vol. 1246, Materials Research Society, 2010.*
(Continued)

*Primary Examiner* — Alan Diamond
(74) *Attorney, Agent, or Firm* — The Webb Law Firm

(57) ABSTRACT

A method and system of forming large-diameter SiC single crystals suitable for fabricating high crystal quality SiC substrates of 100, 125, 150 and 200 mm in diameter are described. The SiC single crystals are grown by a seeded sublimation technique in the presence of a shallow radial temperature gradient. During SiC sublimation growth, a flux of SiC bearing vapors filtered from carbon particulates is substantially restricted to a central area of the surface of the seed crystal by a separation plate disposed between the seed crystal and a source of the SiC bearing vapors. The separation plate includes a first, substantially vapor-permeable part surrounded by a second, substantially non vapor-permeable part. The grown crystals have a flat or slightly convex growth interface. Large-diameter SiC wafers fabricated from the grown crystals exhibit low lattice curvature
(Continued)

and low densities of crystal defects, such as stacking faults, inclusions, micropipes and dislocations.

22 Claims, 4 Drawing Sheets

(51) Int. Cl.

| | |
|---|---|
| ***C30B 23/00*** | (2006.01) |
| ***C30B 29/36*** | (2006.01) |
| ***B28D 5/00*** | (2006.01) |

(56) References Cited

U.S. PATENT DOCUMENTS

| | | | | |
|---|---|---|---|---|
| 6,056,820 | A | 5/2000 | Balakrishna et al. | |
| 6,428,621 | B1 | 8/2002 | Vodak et al. | |
| 6,800,136 | B2 | 10/2004 | Snyder et al. | |
| 7,294,324 | B2 | 11/2007 | Powell et al. | |
| 7,314,520 | B2 | 1/2008 | Powell et al. | |
| 7,314,521 | B2 | 1/2008 | Powell et al. | |
| 7,449,065 | B1 | 11/2008 | Powell et al. | |
| 7,589,358 | B2 | 9/2009 | Dwilinski et al. | |
| 7,608,524 | B2 | 10/2009 | Gupta et al. | |
| 8,216,369 | B2 | 7/2012 | Gupta et al. | |
| 8,313,720 | B2 | 11/2012 | Zwieback et al. | |
| 8,384,090 | B2 | 2/2013 | Powell et al. | |
| 8,410,488 | B2 * | 4/2013 | Basceri et al. | 257/77 |
| 2003/0037724 | A1 | 2/2003 | Snyder et al. | |
| 2006/0177362 | A1 | 8/2006 | D'Evelyn et al. | |
| 2006/0243984 | A1 * | 11/2006 | Gupta et al. | 257/77 |
| 2008/0190355 | A1 | 8/2008 | Chen et al. | |
| 2010/0061914 | A1 * | 3/2010 | Zwieback et al. | 423/345 |
| 2010/0139552 | A1 | 6/2010 | Rengarajan et al. | |
| 2011/0155048 | A1 * | 6/2011 | Kojima | 117/84 |
| 2011/0303884 | A1 * | 12/2011 | Gupta et al. | 252/512 |
| 2012/0103249 | A1 | 5/2012 | Gupta et al. | |
| 2012/0285370 | A1 | 11/2012 | Gupta et al. | |
| 2013/0061801 | A1 * | 3/2013 | Fujiwara et al. | 117/105 |
| 2014/0190413 | A1 * | 7/2014 | Son et al. | 118/726 |

FOREIGN PATENT DOCUMENTS

| | | | |
|---|---|---|---|
| JP | 2011178590 | A | 9/2011 |
| WO | 2010/111473 | A1 | 9/2010 |
| WO | 2011034850 | A1 | 3/2011 |

OTHER PUBLICATIONS

Blevins et al, "Development of a Manufacturing Process for Large Diameter Semi-Insulating Silicon Carbide Substrates," CS Mantech Conference, May 16-19, 2011, Palm Springs, CA, USA.*

Korean application 10-2011-0057429 with machine translation, Jun. 11, 2014.*

Machine English translation of JP 2011-178590, Sep. 2011.*

D. Nakamura et al., "Ultrahigh-Quality Silicon Carbide Single Crystals", Nature, (2004), pp. 1009-1012, vol. 430.

M. Lapedus, "Cree devises 150-mm SiC wafers", EE Times, Aug. 31, 2010.

Cree, "Cree Introduces 150-mm 4HN Silicon Carbide Epitaxial Wafers", Cree News, Aug. 30, 2012.

* cited by examiner

LARGE DIAMETER, HIGH QUALITY SIC SINGLE CRYSTALS, METHOD AND APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF INVENTION

1. Field of Invention

The invention relates to high-quality, large-diameter silicon carbide (SiC) single crystals of 4H and 6H polytype and the sublimation growth process thereof. The SiC single crystals of invention can be used in semiconductor, electronic and optoelectronic devices, such as high power and high frequency diodes and transistors, ultra-fast semiconductor optical switches, detectors working in harsh environments and many others.

The invention is an improved process of SiC sublimation crystal growth. The main novel aspect of the invention is in control of the vapor transport and temperature gradients, wherein said transport is restricted to the central area of the growing crystal, while the crystal and its environs are under conditions of near-zero radial temperature gradients. This leads to the advantageously shaped growth interface, such as flat or slightly convex towards the source, reduced crystal stress and reduced densities of crystal defects.

Other novel aspects of the invention include in-situ densification of the SiC source by sublimation and filtration of the vapor from particulates originating from the SiC source. As an optional feature, the invention comprises a step of in-situ synthesis of the SiC source from elemental components.

The SiC single crystals grown by the growth process of invention are suitable for the fabrication of large-diameter, high-quality SiC single crystal substrates of 4H and 6H polytype, n-type and semi-insulating, including substrates of 100 mm, 125 mm, 150 mm and 200 mm in diameter.

2. Description of Related Art

Over the last decade, significant progress has been achieved in SiC crystal growth and substrate manufacturing. Currently, the largest SiC substrates available commercially are 4H and 6H SiC wafers of 100 mm in diameter. 150 mm substrates have been under development, and, recently, limited quantities of 150 mm n-type substrates became available on trial or sampling basis. Broad implementation of 150 mm diameter SiC substrates and, in the future, 200 mm substrates will enable significant cost reduction of SiC- and GaN-based semiconductor devices.

Development-grade 150 mm n-type wafers are known in the art. However, progress in SiC-based devices is still hampered by the scarcity of commercially available, high-quality 150 mm SiC substrates and by the absence of 200 mm substrates.

Harmful defects in SiC substrates include: dislocations, micropipes, stacking faults, inclusions of foreign polytypes and carbon inclusions. Stress in the SiC substrate is another factor detrimental to the device performance and technology.

Dislocations and Micropipes

The main dislocation types in hexagonal SiC are: Threading Screw Dislocations (TSD), Threading Edge Dislocations (TED) and Basal Plane Dislocations (BPD). The term 'threading' means that the dislocation line is approximately parallel to the hexagonal <0001> axis. The term 'basal' means that the dislocation line lies in the basal hexagonal (0001) plane. TSDs cause leakage and device degradation, while BPDs lead to the generation of stacking faults under bias and, subsequently, to the terminal device failure. TEDs are viewed as relatively benign defects.

Micropipes (MP) are hollow-core TSDs with the Burgers vector exceeding 3c, where c is the lattice parameter. 4H SiC homoepitaxial layers are commonly grown on 4° off-cut substrates, whereupon at least a fraction of dislocations and micropipes present extends into the epilayer from the substrate. MPs are "device killers" causing severe charge leakage even at low bias voltages.

Etching in KOH-based fluxes is commonly used to reveal etch pits due to dislocations and MPs—each dislocation type produces etch pits of characteristic geometry. In addition to etching, MP density (MPD) can be determined optically, by studying polished SiC wafers under a polarizing microscope. Upon etching on-axis SiC wafers (i.e. oriented parallel to the hexagonal c-plane) or wafers oriented several degrees off-axis, each threading dislocation and MP produces one etch pit on the wafer surface. Therefore, MP, TSD and TED densities are measured as the number of corresponding etch pits per 1 $cm^2$ of the wafer surface.

The terms 'dislocation density', 'total dislocation density' and 'wafer-average dislocation density' used in the SiC related literature and in the present disclosure are understood as the density of etch pits per 1 $cm^2$ of the wafer surface and, therefore, signify the density of threading dislocations.

BPD lines are in the basal plane, and the number of etch pits BPDs produce depends on the wafer off-cut angle. For instance, BPDs do not produce etch pits in on-axis wafers. The best way to reveal BPDs is by x-ray topography, where they are visible as a plurality of curved lines. Accordingly, the BPD density is calculated as the total length of the BPD lines (cm) per total analyzed volume of the substrate ($cm^3$), i.e. in the units of $cm/cm^3$.

Micropipes are hollow-core TSDs with the Burgers vector exceeding 3c, where c is the lattice parameter. Micropipes are stress concentrators triggering generation of BPD loops around the micropipe. Micropipes are "device killers" causing severe charge leakage even at low bias voltages. In addition to etching, micropipe density (MPD) can be determined optically, by studying polished SiC wafers under a polarizing microscope.

3" and 100 mm SiC substrates with MPD=0 have been demonstrated by several commercial manufacturers. However, average MPD values in commercial substrates are, typically, higher than 0.1-0.2 $cm^2$.

Stacking Faults

For 4H and 6H polytypes, the normal stacking sequences in the <0001> direction are 'ABCB' and 'ABCACB', respectively. Stacking faults (SFs) are two-dimensional defects violating the ideal stacking sequence and emerging as a result of non-optimized growth conditions. During homoepitaxial growth on 4° off-cut 4H SiC substrates, SFs propagate from the substrate into the epilayer. The presence of SFs can be detected by x-ray topography and photoluminescence. Based on the x-ray topography, the SF density can be expressed as percentage of the substrate area occupied by SFs. SFs are terminal for the devices.

Inclusions of Foreign Polytypes

Free energies of various SiC polytypes are close, and polytype inclusions, such as 15R, are frequently observed in 4H and 6H crystals, especially when the growth conditions are non-optimized or unstable. The lattice of 15R is rhombohedral, and 15R inclusions in hexagonal 4H and 6H lead to crude defects, such as dislocation walls and clusters of micropipes.

Carbon Inclusions

Carbon inclusions are common in SiC crystals, and their origin is usually assigned to the spent, carbonized SiC source. Evaporation of SiC is incongruent, with the vapor enriched with silicon. As a result, gradual accumulation of the carbon residue, which is a light and flaky substance, takes place during growth. Carbon particles from the residue become airborne and, transported by the vapor flux, incorporate into the growing crystal. Carbon inclusions, which can be from a fraction of a millimeter to several microns in size, are often visible in a polished wafer as light-scattering clouds. Large carbon inclusions lead to micropipes, while clouds of small-size inclusions increase the dislocation density.

X-Ray Quality

The method of x-ray rocking curves provides quantitative information on the lattice curvature and broadening of the x-ray reflection. The lattice curvature is expressed as $\Delta\Omega$, which is a variation of the sample angle $\Omega$ between different points on the wafer surface ($\Delta\Omega=\Omega_{MAX}-\Omega_{MIN}$). High values of $\Delta\Omega$ are indicative of strong lattice deformation. In highest quality SiC substrates, $\Delta\Omega$ is below 0.1°, while in present-day commercial SiC substrates, $\Delta\Omega$ values as high as 0.2-0.3° are often observed.

X-ray reflection broadening is expressed as Full Width at Half Maximum (FWHM) of the reflection peak. High FWHM values are a consequence of lattice disorder, such as high density of dislocations and low-angle grains. For highest quality 4H SiC substrates, the value of FWHM is on the order of 10-12 arc-seconds and comparable to the angular divergence of the incident monochromatic x-ray beam. In the present-day commercial SiC wafers, the values of FWHM are, typically, above 15 arc-seconds and up to 75-100 arc-seconds. A FWHM value above 25-30 arc-seconds is a sign of inferior crystal quality.

Stress

In a SiC wafer, one can distinguish global, wafer-size stress and local stress. The magnitude of stress can be quantified by Raman spectroscopy or by special x-ray methods. However, a much simpler, qualitative technique is routinely applied to SiC wafers—visual inspection under crossed polarizers. Based on the cross-polarizer contrast, the level of stress and its uniformity can be assessed qualitatively, and various macroscopic defects, such as dislocation clusters, polytype inclusions, grain boundaries, etc. can be found. The cross-polarizer contrast is usually classified qualitatively as 'low', 'medium' or 'high'.

SiC Sublimation Growth of Prior Art

The sublimation technique of Physical Vapor Transport (PVT) is widely used for the growth of commercial-size SiC single crystals. A conventional SiC sublimation growth cell of Prior Art is shown schematically in FIG. 1. The process is carried out in a gas-tight chamber 10, which is usually made of fused silica. The chamber 10 includes a growth crucible 11 and thermal insulation 12 which surrounds the crucible 11. The growth crucible 11 is generally made of dense, fine-grain graphite, while the thermal insulation 12 is made from lightweight, fibrous graphite. Most commonly, heating is provided by a single RF coil 16, which couples electromagnetically to the crucible 11. However, the use of resistive heating is envisioned.

The crucible 11 includes SiC sublimation source 14 and a SiC single crystal seed 15. Most commonly, the source 14 (polycrystalline SiC grain) is disposed at the bottom of the crucible 11, while the seed 15 at the top, for instance, is attached to crucible lid 11a.

At growth temperatures (typically, between 2000° C. and 2400° C.), the SiC source 14 vaporizes and fills the crucible with vapors of $Si_2C$, $SiC_2$ and Si molecules. During growth, the temperature of the source 14 is maintained higher than that of the seed 15, leading to temperature gradients in the growth crucible, both axial and radial, on the order of 10-30° C./cm. The vapors migrate to the seed 15 and precipitate on said seed causing growth of a SiC single crystal 17 on the seed 15. The vapor transport in the crucible is signified by arrows 19 in FIG. 1. In order to control the growth rate and ensure crystal quality, sublimation growth is carried out under a small pressure of inert gas, generally, between several and 100 Torr.

As one of ordinary skill in the art of SiC sublimation growth would recognize, two technological factors are crucial to the crystal quality: the magnitude of radial temperature gradients within the growing SiC single crystal 17 and the shape of the crystal growth interface 20. Steep radial gradients cause stress and appearance of stress-related crystal defects, such as BPDs. A strongly curved growth interface, convex or concave, leads to the appearance of crude macrosteps on the interface, stacking faults, inclusions of foreign polytypes and other defects. A concave toward the source (hereafter 'concave') interface leads to the generation and rapid accumulation of various defects during growth. It is generally believed that a flat or slightly convex toward the source (hereafter 'convex') growth interface is the most conducive to high crystal quality.

It is commonly believed that the growth interface follows closely the isotherm shape: concave isotherms result in a concave interface 20, while convex isotherms yield a convex interface 20. Radial temperature gradients are positive when the temperature increases in the radial direction from the crucible axis toward the crucible wall. Positive radial temperature gradients produce convex isotherms. Radial temperature gradients are negative when the temperature decreases in the radial direction from the crucible axis toward the crucible wall. Negative radial temperature gradients produce concave isotherms. A zero radial gradient produces flat isotherms.

The conventional, single-coil SiC sublimation growth arrangement from FIG. 1 suffers from poorly controllable radial temperature gradients, especially when the crystal diameter is large. With increase in the diameter of the crucible 11 and the RF coil 16, electromagnetic coupling between crucible 11 and RF coil 16 becomes less efficient, thermal fields less uniform and radial gradients steeper. A SiC sublimation growth method aimed at reduction of the harmful radial gradients is disclosed in U.S. Pat. No. 6,800,136 (hereinafter "the '136 patent").

The SiC sublimation growth system disclosed in the '136 patent utilizes two independent flat heaters, namely, a source heater and a boule heater, which can be either inductive or resistive. The heaters are positioned coaxially with the crucible—the source heater is disposed below the source material, while the boule heater is disposed above the growing crystal. In order to reduce the radial heat losses, desirably to zero, the growth apparatus of the '136 patent comprises thick cylindrical thermal insulation with an option of an additional cylindrical heater disposed around the growth cell. Disadvantages of the growth system disclosed in the '136 patent include poor coupling of the flat coils to the cylindrical crucible, while disk-shaped resistive heaters obstruct heat dissipation in the axial direction, leading to strongly negative radial gradients.

An improved SiC sublimation growth method disclosed in US 2010/0139552 is shown in FIG. 2A. The growth apparatus includes cylindrical growth crucible [20] *30* including SiC source material 21, a SiC seed 22 and a SiC single crystal 23 growing on the seed 22. The crucible [20] *30* is positioned between two resistive heaters, top heater 28 and bottom heater 29, disposed coaxially with the crucible [20] *30*. The growth crucible [20] *30* and heaters 28 and 29 are surrounded by thermal insulation (not shown).

The top heater 28 is ring-shaped with through hole 28a at the center. The bottom, cup-shaped heater 29 comprises two sections: ring-shaped section 29a with central hole 29b and cylindrically-shaped section 29c. The bottom heater 29 is disposed below and around the source material 21 included in the growth crucible [20] *30*.

FIG. 2B shows results of modeling of the growth cell from FIG. 2A. The isotherms *25* and the contour of a 3 inch diameter SiC crystal 23 were obtained by finite element simulation. The thermal field in the crucible [20] *30* can be tuned by adjusting the current supplied to the heaters 29 and 28 to produce positive and shallow radial gradients within the crystal 23. Still, when this improved technique was applied to the growth of larger-diameter boules, such as 150 mm diameter boules, the growth interface was concave or wavy, such as concave at the center and convex at the periphery.

This is illustrated in FIG. 3, which depicts a growth cell similar to that of FIG. 2A, but scaled up for the growth of 150 mm crystals. The isotherms 35 and the contour of a 150 mm SiC crystal 33 growing on a SiC seed crystal 34 were obtained by finite element simulation. One can see that in spite of the isotherm convexity, the growth interface at the center of crystal 33 is concave.

A common practical approach to achieving the convex growth interface is in further increase of the isotherm convexity. However, strongly convex isotherms and associated with them steep radial gradients cause stress and crystal defects. It is postulated herein that the common perception of the growth interface following closely the shape of the isotherms is inaccurate, and that the interface shape is determined not only by the isotherms, but by the geometry of the vapor transport as well.

Generally, the temperature distribution within the SiC source material 31 is spatially nonuniform with the highest temperatures reached in the areas 36 adjacent to the crucible walls. During growth, the source vaporizes from these hotter areas 36, leaving carbon residue behind, while a denser SiC body 37 is formed in the colder top area of the source material 31. As a result, vapors from the source material 31 arrive predominantly at the periphery of the growing SiC crystal 33, as shown by arrows [34] *34'* in FIG. 3. The vapor molecules adsorb on the growth interface and diffuse in the adsorbed state towards the colder center of the SiC single crystal 33 boule. With this geometry of vapor transport, the growth interface at the center of the growing SiC crystal 33 has a tendency to be concave, especially, when the boule diameter is large. Reference numbers 38 and 39 in FIG. 3 correspond to heaters 28 and 29, respectively, in FIGS. 2A and 2B.

The effect of the vapor transport geometry on the crystal shape is illustrated in FIGS. 4A and 4B, which show two 150 mm boule contours produced by finite element modeling of heat and mass transport. The thermal boundary conditions were chosen to produce zero radial gradients, that is, flat isotherms. In the case shown in FIG. 4A, the vapors were supplied to the SiC single crystal boule periphery, yielding a concave interface at the center of the boule. In the case shown in FIG. 4B the vapors were supplied to the SiC single crystal boule center, yielding a convex interface at the center of the boule.

Another common problem of SiC sublimation growth is carbon inclusions originating from the spent (carbonized) source.

While the prior art of SiC sublimation growth is broad and numerous, there is still a need for a process that can reproducibly yield high-quality SiC single crystals suitable for the fabrication of high-quality, large-diameter SiC substrates, such as 100 mm, 125 mm, 150 mm and 200 mm in diameter.

SUMMARY OF THE INVENTION

Disclosed herein is a method of fabricating a SiC single crystal comprising: (a) sublimation growing a SiC single crystal on a surface of seed crystal in the presence of a temperature gradient[, while controlling said gradient to achieve a substantially shallow radial gradient in the crystal and its environs; and (b) during step (a), controlling the flux of SiC bearing vapors by substantially restricting said flux to a central area of the surface of the seed crystal]*; and (b) during step (a), controlling said temperature gradient such that a radial temperature gradient in the SiC single crystal is positive and shallow, and controlling a flux of SiC bearing vapors by restricting said flux to a central area of the surface of the seed crystal via a separation plate disposed between the seed crystal and a source of the SiC bearing vapors, wherein the separation plate includes an outer flux permeable part surrounding an inner flux permeable part that is more permeable to the flux of SiC bearing vapors than the outer flux permeable part, wherein the central area of the surface of the seed crystal is between 30% and 60% of a total surface area of the seed crystal around a center of the seed crystal, wherein a ratio of mass transport of the SiC bearing vapors through 1 cm$^2$ of area of the inner part of the separation plate versus the mass transport of the SiC bearing vapors through 1 cm$^2$ of area of the outer part of the separation plate is no less than 50/1.*

[The central area of the surface of the seed crystal can be between 30% and 60% of a total surface area of the seed crystal substantially around a center of the seed crystal.]

Step (b) can include controlling the flux of SiC bearing vapors by restricting said flux to the central area of the surface of the seed crystal via a separation plate disposed between the seed crystal and a source of the SiC bearing vapors.

The separation plate can be spaced between about 25% and 75% of the seed diameter from the seed crystal.

The separation plate can have a thickness between about 4 mm and 10 mm.

The separation plate can be made from a material that is not reactive to the SiC bearing vapors or the separation plate can include a coating to avoid contact between the material forming the separation plate and the SiC bearing vapors.

The separation plate can include a first, outer part surrounding a second, inner part that is substantially more permeable to the SiC bearing vapors than the first, outer part.

The second, inner part of the separation plate can comprise between 20% and 50% of a total area of the separation plate. The separation plate can be made from at least one of the following: graphite, a refractory compound, tantalum carbide, or niobium carbide. A ratio of mass transport of the SiC bearing vapors through 1 cm$^2$ area of the inner part of the separation plate versus the mass transport of the SiC bearing vapors through 1 $cm^2$ area of the outer part of the separation plate can be no less that about 50/1.

The separation plate can be configured to substantially remove particles from the flux of the SiC bearing vapors.

Step (a) can further include growing the SiC single crystal by sublimation in the presence of both of the following: an isotherm that is convex in a direction facing a source of the SiC bearing vapors; and a radial temperature gradient of no more than about 10 K/cm.

A difference in thickness between a center of the grown SiC single crystal and a diameter of the wafer to be sliced from the grown SiC single crystal in a growth direction of the SiC single crystal can be no more than about 6 mm.

The method can further include slicing from the grown SiC single crystal a wafer having one or more of the following properties: a combined area of stacking faults no more than about 5%, 2%, or 1% of a total area of the wafer; or a lattice curvature of no more than about 0.2°, 0.1°, or 0.06°, over the total area of the wafer; or a full width at half maximum (FWHM) of the x-ray reflection of no more than about 50, 30, or 20 arc-seconds over the total area of the wafer; or a wafer-average micropipe density (MPD) of no more than about 1 $cm^{-2}$, 0.2 $cm^{-2}$, or 0.1 $cm^{-2}$; or a wafer-average dislocation density of no more than about 10,000 $cm^{-2}$, 5,000 $cm^{-2}$, or 1,000 $cm^{-2}$.

The grown SiC single crystal can have a diameter suitable for the fabrication of wafers having a diameter between 100 mm and 200 mm[, inclusive].

The method can further include slicing from the grown SiC single crystal a wafer having one or more of the following properties: a wafer-average micropipe density no more than about an average of 1 $cm^{-2}$; or a percentage of micropipe-free 2×2 mm square dies extracted from the wafer of not less than about 95%; or a percentage of micropipe-free 5×5 mm square dies extracted from the wafer of not less than about 90%; or a wafer-average density of dislocations not more than about $10^4$ $cm^{-2}$; or a density of threading screw dislocations of not more than about 1000 $cm^{-2}$; or a density of basal plane dislocations of not more than about 300 $cm/cm^3$; or zero density of foreign polytype inclusions; or one or more clouds of carbon inclusions of no more than about 5% of the total wafer area; or edge-to-edge lattice curvature no more than about 0.15°; or a full width at half maximum (FWHM) x-ray reflection of no more than about 25 arc-seconds over the total area of the wafer.

Also disclosed is a SiC sublimation growth system comprising: a growth crucible configured to be charged with SiC source material and a SiC seed crystal in spaced relation; and a separation plate separating the growth crucible into a source compartment where the SiC source material resides when the growth crucible is charged with the SiC source material and a crystallization compartment where the SiC seed crystal resides when the growth crucible is charged with the SiC seed crystal, wherein: [the separation plate includes a first, central part surrounded by a second part that has a lower permeability to SiC bearing vapors originating from the SiC source material during sublimation growth of a SiC crystal on the SiC seed crystal than the first, central part] *the separation plate is spaced from both the SiC source material and the SiC seed crystal; the separation plate includes a central part surrounded by an outer part, wherein the central part and outer part of the separation plate are both permeable to SiC bearing vapors originating from the SiC source material during sublimation growth of a SiC crystal on the SiC seed crystal; the central part of the separation plate has a higher permeability to SiC bearing vapors originating from the SiC source material during sublimation growth of a SiC crystal on the SiC seed crystal than the outer part; the outer part of the separation plate has a lower permeability to the SiC bearing vapors originating from the SiC source material during sublimation growth of the SiC crystal on the SiC seed crystal than the central part; the central part of the separation plate has an area between 20% and 50% of the total area of the separation plate; the separation plate is configured to restrict a flux of the SiC bearing vapors to a central area of the surface of the SiC seed crystal that is between 30% and 60% of a total surface area of the SiC seed crystal around a center of the SiC seed crystal*; and a ratio of mass transport of the SiC bearing vapors through 1 $cm^2$ area of the inner part of the separation plate versus mass transport of the SiC bearing vapors through 1 $cm^2$ area of the outer part of the separation plate is no less that about 50/1.

The separation plate can be made from at least one of the following: graphite, a refractory compound, tantalum carbide, or niobium carbide.

The separation plate can be spaced from the SiC seed crystal at a distance, desirably, between 25% and 75% of the seed diameter below the seed.

The separation plate can include a coating of tantalum carbide, or niobium carbide, and the coating has a thickness between about 20 microns to 40 microns.

The first, central part of the separation plate can include passages, each of which has a maximum diameter between about 0.1 mm and 1 mm.

Also disclosed is a method of forming a large-diameter, high-quality SiC crystal comprising: providing a growth crucible having a top, a bottom and a side that extends between the top of the crucible and a bottom of the crucible; providing a seed crystal at the top of an interior of the crucible, said seed crystal having a diameter of at least 100 mm, and a source material at the bottom of the interior of the crucible; heating the interior of the growth crucible such that a temperature gradient forms between the source material and the seed crystal; the source material is heated to a sublimation temperature and the temperature gradient is sufficient to cause sublimated source material to be transported in the form of vapor to the seed crystal where the vapor precipitates on the seed crystal causing growth of a SiC single crystal on the seed; providing convex toward the source material isotherms in the growing SiC single crystal and its vicinity and controlling the radial temperature gradients in the growing SiC single crystal and its vicinity such that they do not exceed 10K/cm; providing a means for removing carbon particulates from the flux of the sublimated source material transported in the form of vapor from the source to the seed crystal; controlling the geometry of the flux of the sublimated source material to the seed such that upon approaching the seed crystal the vapor flux is controlled by restricting said flux to the central area of the seed crystal, said area, desirably, equal to approximately between 30 and 60% of the seed crystal area; and forming a SiC single crystal boule having a diameter of at least 100 mm and a flat or convex growth interface such that a difference in the boule thickness measured at the boule center and at the diameter of the wafer to be sliced from the grown boule is, desirably, below 6 mm.

The flux of the sublimated source material to the seed can be restricted by a separation plate having distinct areas of substantially different permeability to the vapors generated during sublimation. The source material can be SiC.

Removal of carbon particulates from the flux of the sublimated source material to the seed can be accomplished by filtration of said flux of the sublimated source material across the separation plate.

The separation plate can comprise two parts, one substantially non-permeable to the vapors generated upon SiC sublimation and another substantially vapor-permeable. The vapor-permeable part can be disposed axisymmetrically at the center of the non-permeable part.

The vapor-permeable part can occupy between 20% and 50% of the total plate area. The separation plate can be made from at least one of the following: graphite, a refractory compound, tantalum carbide (TaC) or niobium carbide (NbC).

The material forming the separation plate can be protected against attack by said vapors by a protective coating.

The separation plate can be disposed in the growth crucible below the seed at a distance, desirably, between 25% and 75% of the seed diameter.

Synthesis of polycrystalline SiC source material can be carried out in-situ from elemental carbon and silicon.

Also disclosed is a method of forming a high-quality, large-diameter wafer of SiC single crystal comprising: providing a growth crucible having a top, a bottom and a side that extends between the top of the crucible and a bottom of the crucible; providing a seed crystal at the top of an interior of the crucible and a source material at the bottom of the interior of the crucible; heating the interior of the growth crucible such that a temperature gradient forms between the source material and the seed crystal, whereupon the source material is heated to a sublimation temperature and the temperature gradient is sufficient to cause sublimated source material to be transported in the form of vapor to the seed crystal where the vapor precipitates on the seed crystal causing growth of a SiC single crystal on the seed; forming a SiC single crystal boule of 4H or 6H polytype having a diameter of at least 100 mm; fabricating the formed SiC boule of 4H or 6H polytype into an ingot having a diameter of at least 100 mm and oriented 'on-axis' or 'off-axis' with respect to the crystallographic c-axis; and slicing a wafer from the ingot and polishing the wafer.

The wafer can have at least one of the following properties: a diameter of at least 100 mm; a combined area of stacking faults less than 5% of the total wafer area, as determined by the x-ray topography; a lattice curvature not exceeding 0.2° over the entire wafer area, as determined by the x-ray rocking curves; a Full Width at Half Maximum (FWHM) of the x-ray reflection not exceeding 50 arc-seconds within the entire wafer area, as determined by the double-crystal x-ray rocking curves (monochromatic Cu-Kα beam with the angular divergence of 10-12 arc-seconds and the incident beam area of several $mm^2$); a wafer-average micropipe density (MPD) below 1 per $cm^2$; and/or a wafer-average dislocation density below 10,000 $cm^{-2}$.

Also or alternatively, the wafer can have at least one of the following properties: a combined area of stacking faults less than 2% of the total wafer area, as determined by the x-ray topography; a lattice curvature not exceeding 0.1° over the entire wafer area, as determined by the x-ray rocking curves; a Full Width at Half Maximum of the x-ray reflection not exceeding 30 arc-seconds within the entire wafer area, as determined by the double-crystal x-ray rocking curves (monochromatic Cu-Kα beam with the angular divergence of 10-12 arc-seconds and the incident beam area of several $mm^2$); a wafer-average micropipe density (MPD) below 0.2 per $cm^2$; and/or a wafer-average dislocation density below 5,000 $cm^{-2}$.

Also or alternatively, the wafer can have at least one of the following properties: a combined area of stacking faults less than 1% of the total wafer area, as determined by the x-ray topography; a lattice curvature not exceeding 0.06° over the entire wafer area, as determined by the x-ray rocking curves; a Full Width at Half Maximum of the x-ray reflection not exceeding 20 arc-seconds within the entire wafer area, as determined by the double-crystal x-ray rocking curves (monochromatic Cu-Kα beam with the angular divergence of 10-12 arc-seconds and the incident beam area of several $mm^2$); a wafer-average micropipe density (MPD) below 0.1 per $cm^2$; and/or a wafer-average dislocation density below 1,000 $cm^{-2}$.

Also disclosed is a SiC sublimation growth method comprising: (a) providing a crucible having a top, a bottom and a side that extends between the top of the crucible and a bottom of the crucible, a first resistance heater disposed in spaced relation above the top of the crucible, and a second resistance heater having a first resistive section disposed in spaced relation beneath the bottom of the crucible and a second resistive section disposed in spaced relation around the outside of the side of the crucible; (b) providing a seed crystal at the top of an interior of the crucible and a source material in the interior of the crucible in spaced relation between the seed crystal and the bottom of the crucible; (c) providing a separation plate that divides the growth crucible into a source compartment that includes the SiC source material and a crystallization compartment that includes the SiC seed crystal.

The plate can be at least partially permeable to the technological gases, such as argon, nitrogen, and helium, and vapors generated during sublimation SiC, such as Si, $Si_2C$ and $SiC_2$. The plate can be made of a material that is either not reactive to vapors generated during sublimation growth of a SiC single crystal, or protected against attack by said vapors by a protective coating.

The plate can comprise two parts, one substantially non vapor-permeable and another substantially vapor-permeable. The vapor-permeable part is disposed axisymmetrically at the center of the non vapor-permeable part, said vapor-permeable part can occupy between 20% and 50% of the total plate area.

The plate can be made from graphite, a refractory compound, tantalum carbide (TaC), and/or niobium carbide (NbC). The plate can have a thickness between 4 and 10 mm. The plate can be disposed in the growth crucible at a distance, desirably, between 25% and 75% of the seed diameter below the seed.

The central, vapor-permeable part of the separation plate can include a plurality of through holes or passages.

The method can further include applying electrical power to the first and second resistance heaters of a sufficient extent to raise the crucible temperature to the SiC sublimation temperature and create in the interior of the crucible temperature gradients, including: a temperature gradient in the seed compartment of the crucible, said seed compartment temperature gradient is controlled to have its radial component positive (i.e., cooler at the center of the seed compartment and hotter adjacent the wall of the crucible) and not exceeding 10 K/cm in magnitude, and a temperature gradient in the source compartment of the crucible, said source compartment temperature gradient being of sufficient magnitude to cause the initial source material to sublime and condense on the separation plate thereby forming a densified polycrystalline SiC body.

The method can further include maintaining the electrical power to the first and second resistance heaters to: cause the densified polycrystalline SiC body to sublime and generate the vapor; force the vapor generated upon sublimation of the densified polycrystalline SiC body to move across the vapor-permeable central area of the separation plate; force the vapor passed across the vapor-permeable portion of the separation plate to move to the central area of the seed and condense on said seed causing the crystal to grow; and grow the crystal to a desired size.

All steps can occur in the presence of inert gas at a pressure between 1 and 100 Torr.

The method can further include: charging the growth crucible with elemental Si and C in the source compartment separated from the crystallization compartment by the separation plate; and, prior to heating the SiC source material to the sublimation temperature, heating the elemental Si and C to a temperature below the sublimation temperature for synthesis of the elemental Si and C into a solid SiC in the source compartment, said solid SiC comprises the initial SiC source material.

Large-diameter, high-quality SiC substrates of 4H and 6H polytype grown by the above method can have a diameter between 100 mm and 200 mm, [inclusive,] including semiconductor industry standard diameters of 100 mm, 125 mm, 150 mm and 200 mm. The substrates having "on-axis" orientation with respect to the hexagonal basis plane (0001), i.e. with the wafer faces parallel to the (0001) plane; substrates having "off-axis" orientation with respect to the hexagonal basis plane (0001), i.e. with the wafer faces deviating from the (0001) plane by an angle of 4° or less.

The substrates can have low concentrations of extended lattice defects, including:

Low micropipe density: with the wafer-average density of micropipe-related etch pits not exceeding 1 $cm^{-2}$, as determined by etching in KOH-based molten salts, or by a suitable optical technique; with the percentage of micropipe-free square dies on the wafer surface exceeding 95% for the 2×2 $mm^2$ dies; with the percentage of micropipe-free square dies on the wafer surface exceeding 90% for the 5×5 $mm^2$ dies.

Low dislocation density: with the wafer-average total density of dislocation etch pits not exceeding $1.10^4$ $cm^{-2}$, as determined by etching in KOH-based molten salts; with the density of threading screw dislocations (TSD) not exceeding 1000 $cm^{-2}$, as determined by etching in KOH-based molten salts or by suitable methods of x-ray topography; with the density of basal plane dislocations (BPD) not exceeding 300 $cm/cm^3$, as determined by suitable methods of x-ray topography.

Zero density of foreign polytype inclusions:

Low density of carbon inclusions: the wafer area affected by the clouds of microscopic carbon inclusions not to exceed 5% of the total wafer area, as determined by bright light inspection, optical scattering or other suitable optical technique, such as Candela;

High x-ray quality: edge-to-edge lattice curvature not exceeding 0.15°, as determined by the x-ray rocking curve scanning; the Full Width at Half Maximum (FWHM) of the x-ray reflection not to exceed 25 arc-seconds per entire wafer area, as determined by scanning with the x-ray rocking curves (monochromatic Cu-Kα beam with the angular divergence of 10-12 arc-seconds and the incident beam area of several $mm^2$)

Also disclosed is SiC physical vapor transport growth apparatus comprising: a growth crucible having a top, a bottom and a side that extends between the top of the crucible and the bottom of the crucible, said crucible adapted to support a seed crystal at the top of an interior of the crucible and a source material in the interior of the crucible in spaced relation between the seed crystal and the bottom of the crucible, a space between the source material and the seed is divided into a source compartment that includes the source material and a crystallization compartment that includes the seed by a separating plate which is at least partially permeable to technological gases, such as argon, nitrogen and helium, and vapors generated upon sublimation of silicon carbide, such as Si, $Si_2C$ and $SiC_2$; the space between the source material and the bottom of the crucible can define a cavity in the interior of the crucible; a first resistance heater is disposed in spaced relation above the top of the crucible; and a second resistance heater has a first section disposed in spaced relation beneath the bottom of the crucible and a second section disposed in spaced relation around the outside of the side of the crucible. The source material and the seed crystal can be made from SiC.

The first and second resistance heaters can be operative for sublimation growing on the seed crystal disposed at the top of an interior of the crucible a growth crystal having a convex growth interface, wherein a difference in thickness between a center of the grown SiC single crystal and a diameter of the wafer to be sliced from the grown SiC single crystal in a growth direction of the SiC single crystal can be no more than about 6 mm The top and bottom of the crucible can be round. The first resistance heater can be disk-shaped and a first section of the second resistance heater can be disk-shaped.

The first heater and the first section of the second resistance heater can have outer diameters that are between 110% and 130%, inclusive, of the outer diameter of the respective top and bottom of the growth crucible.

The first resistance heater and the first section of the second resistance heater can have central holes with a diameter between 25% and 75% of a diameter of the growth crucible.

The side of the crucible can be cylindrical-shaped, and the second section of the second resistance heater can be cylindrical-shaped.

The top of the second section of the second resistance heater can be disposed at a position between 50% and 75% of the height of the crucible.

The inner diameter of the second section of the second resistance heater can be spaced from the crucible by a radial distance between 10 mm and 25 mm The growth crucible can be divided by a separation plate into a source compartment that includes the SiC source material and a crystallization compartment that includes the SiC seed crystal.

The plate can be at least partially permeable to technological gases, such as argon, nitrogen, and helium, and vapors generated during sublimation SiC, such as Si, $Si_2C$ and $SiC_2$. The plate can be made of a material that is either not reactive to vapors generated during sublimation growth of a SiC single crystal, or protected against attack by said vapors by protective coating.

The plate can include two parts, one substantially non vapor-permeable and another substantially vapor-permeable. The substantially vapor-permeable part can be disposed axisymmetrically at the center of the substantially non vapor-permeable part. The substantially vapor-permeable part can occupy between 20% and 50% of the total plate area.

The plate can be made of graphite, a refractory compound, tantalum carbide (TaC) and/or niobium carbide (NbC). The plate can have a thickness between 4 and 10 mm. The plate can be disposed in the growth crucible at a distance, desirably, between 25% and 75% of the seed diameter below the seed crystal.

The vapor permeable central part can be made from large-grain, open-porosity porous graphite. The separation plate can be protected against vapor erosion by high-temperature CVD coating with tantalum carbide (TaC) or niobium carbide (NbC), with a coating thickness, desirably, between 20 and 40 microns.

The vapor-permeable part can be made of porous graphite having its surface and porous bulk CVD coated, desirably, with a refractory compound of tantalum carbide (TaC) or niobium carbide (NbC), said coating having a thickness, desirably, between 20 and 40 microns.

The central, vapor-permeable part of the separation plate can include a plurality of passages or through holes, each of which has a maximum diameter, desirably, between 0.1 and 1 mm.

The surfaces of the separation plate can be protected against vapor erosion by CVD coating with a refractory compound of tantalum carbide (TaC) or niobium carbide (NbC), said coating having its thickness, desirably, between 20 and 40 microns.

Also disclosed is a method of forming a high-quality SiC single crystal wafer comprising: sublimation growing on a SiC single crystal seed a SiC single crystal boule having a diameter sufficient for slicing wafers between 100 and 200 mm in diameter, wherein said sublimation growth occurs in the presence of controlled axial and radial temperature gradients and *a* controlled flux of sublimated source material *that is restricted, via a separation plate that is spaced from the source material and the SiC single crystal seed, to a central area of the surface of the SiC single crystal seed that is between 30% and 60% of a total surface area of the SiC single crystal seed around a center of the SiC single crystal seed, wherein the separation plate includes an outer flux permeable part surrounding an inner flux permeable part that is more permeable to the flux of sublimated source material than the outer flux permeable part, wherein a ratio of mass transport of the SiC bearing vapors through 1 cm$^2$ of area of the inner part of the separation plate versus the mass transport of the SiC bearing vapors through 1 cm$^2$ of area of the outer part of the separation plate is no less than 50/1*; and slicing from said SiC *single crystal* boule a SiC *single crystal* wafer having: a diameter between 100 and 200 mm [inclusive]; a lattice curvature of no more than [about] 0.2°, 0.1°, or 0.06° over the total area of the wafer; and a full width at half maximum (FWHM) of [the] x-ray reflection of no more than [about] 50, 30, or 20 arc-seconds over the total area of the wafer.

The SiC wafer can further include a combined area of stacking faults no more than about 5%, 2%, or 1% of a total area of the wafer.

The SiC wafer can further include at least one of the following: a wafer-average micropipe density (MPD) of no more than about 1 cm$^{-2}$, 0.2 cm$^{-2}$, or 0.1 cm$^{-2}$; or a wafer-average dislocation density of no more than about 10,000 cm$^{-2}$, 5,000 cm$^{-2}$, or 1,000 cm$^{-2}$.

Also disclosed is a method of forming a high-quality SiC single crystal wafer comprising: sublimation growing on a SiC single crystal seed a SiC single crystal boule having a diameter sufficient for slicing wafers between 100 and 200 mm in diameter, wherein said sublimation growth occurs in the presence of controlled axial and radial temperature gradients and *a* controlled flux of sublimated source material *that is restricted, via a separation plate that is spaced from the source material, to a central area of the surface of the SiC single crystal seed that is between 30% and 60% of a total surface area of the SiC single crystal seed around a center of the SiC single crystal seed, wherein the separation plate includes an outer flux permeable part surrounding an inner flux permeable part that is more permeable to the flux of sublimated source material than the outer flux permeable part, wherein a ratio of mass transport of the SiC bearing vapors through 1 cm$^2$ of area of the inner part of the separation plate versus the mass transport of the SiC bearing vapors through 1 cm$^2$ of area of the outer part of the separation plate is no less than 50/1*; and slicing from said SiC *single crystal* boule a SiC *single crystal* wafer having a combined area of stacking faults no more than [about] 5%, 2%, or 1% of a total area of the *SiC single crystal* wafer.

The SiC wafer can further include a lattice curvature of no more than about 0.2°, 0.1°, or 0.06° over the total area of the wafer.

The SiC wafer can further include a full width at half maximum (FWHM) of the x-ray reflection of no more than about 50, 30, or 20 arc-seconds over the total area of the wafer.

The SiC wafer can further include at least one of the following: a wafer-average micropipe density (MPD) of no more than about 1 cm$^{-2}$, 0.2 cm$^{-2}$, or 0.1 cm$^{-2}$; or a wafer-average dislocation density of no more than about 10,000 cm$^{-2}$, 5,000 cm$^{-2}$, or 1,000 cm$^{-2}$.

Also disclosed is a high-quality *sublimation grown* SiC single crystal wafer having a diameter [between] *of* 100 [and] *mm, 125 mm, 150 mm or* 200 mm [and], *said SiC single crystal wafer sliced from a SiC single crystal boule sublimation grown on a SiC seed crystal by a controlled flux of sublimated source material that is restricted to a central area of the surface of the SiC seed crystal that is between 30% and 60% of a total surface area of the SiC seed crystal around a center of the SiC seed crystal, the SiC single crystal wafer, wherein the separation plate includes an outer flux permeable part surrounding an inner flux permeable part that is more permeable to the flux of sublimated source material than the outer flux permeable part,* comprising [at least one of] the following: a lattice curvature of no more than about 0.2°, 0.1°, or 0.06° over the total area of the *SiC single crystal* wafer; [or] *and* a full width at half maximum (FWHM) of [the] x-ray reflection of no more than [about] 50, 30, or 20 arc-seconds over the total area of the *SiC single crystal* wafer; [or] *and* a combined area of stacking faults no more than [about] 5%, 2%, or 1% of a total area of the *SiC single crystal* wafer.

The crystal can comprise either a 4H polytype or a 6H polytype.

DETAILED DESCRIPTION OF THE INVENTION

The invention is an improved SiC sublimation growth process applicable to the growth of high-quality, large-diameter SiC crystals. The invention is aimed at producing flat or slightly convex growth interface by controlling temperature gradients in the growth cell and the flux of the sublimated source material, wherein the gradients are controlled to produce positive and substantially shallow radial gradients in the crystal and its environs not exceeding 10 K/cm and wherein the flux of the sublimated source material is controlled by restricting the vapor transport from the source to the central area of the boule. In addition, in-situ densification of the SiC source by sublimation and filtration of the vapors supplied to the growing SiC crystal from particulates are disclosed, as well as an optional in-situ synthesis of the SiC source.

First Embodiment

Figure 5:
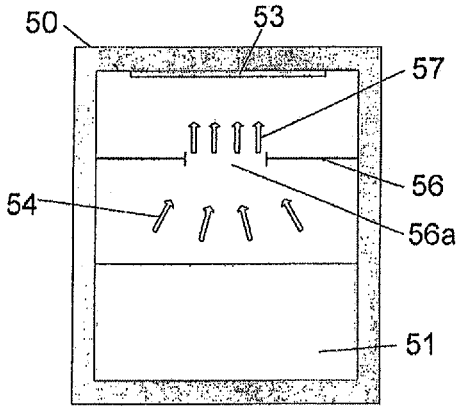
FIG. 5 is a SiC sublimation growth cell according to one embodiment of the present invention.

The principle of invention is illustrated in FIG. 5. In similarity to conventional SiC sublimation growth, cylindrical crucible 50 includes SiC seed crystal 53 disposed at the top and SiC source material 51 disposed at the bottom. The vapor flux is controlled by a plate 56 disposed in the crucible 50 in the space between the source 51 and seed crystal 53. The chemically inert separation plate 56 is impervious to the vapors 54 and has a central opening 56a. In operation, source 51 vaporizes and generates vapors 54, that migrate toward the seed 53. The opening 56a in plate 56 restricts the vapor flux by forming a vapor column 57. The vapor in column 57 migrates toward the SiC seed crystals 53 and reaches said seed substantially at the central area of the seed 53. This geometry of vapor flux creates a tendency toward convex growth interface. The remaining elements comprising a SiC sublimation growth cell (e.g., FIG. 1) that includes crucible 50 have been omitted from FIG. 5 for simplicity.

Second Embodiment

Figure 6:
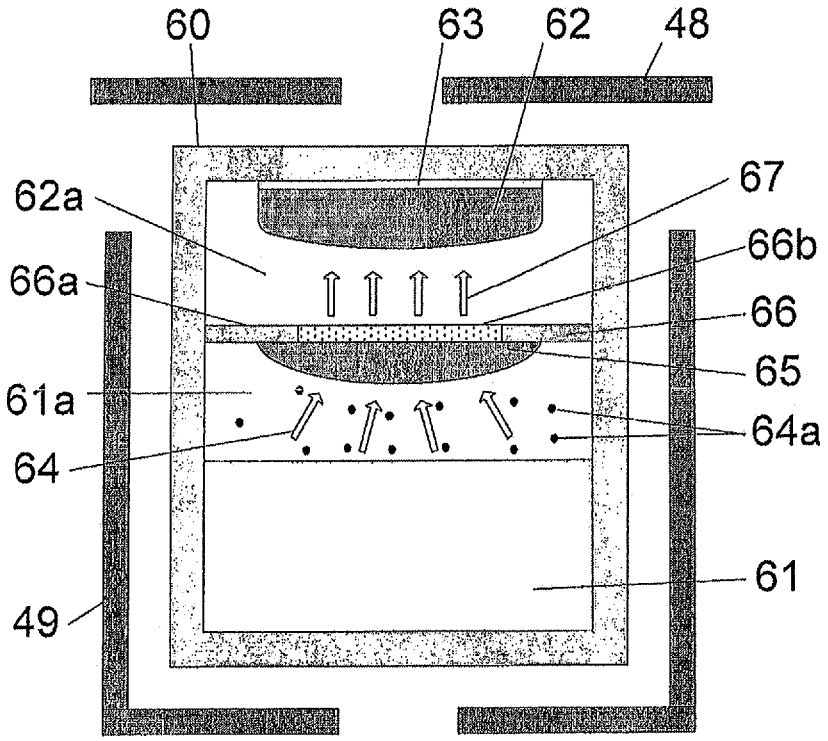
FIG. 6 is a SiC sublimation growth cell according to another embodiment of the present invention.

With reference to FIG. 6, a cylindrical crucible 60 is prepared of dense, fine-grain graphite, such as grade 2020 available from Mersen USA Bay City-MI Corp. 900 Harrison Street, Bay City, Mich. 48708, grade IG-11 available from Toyo Tanso USA, Inc. 2575 NW Graham Circle, Troutdale, Oreg. 97060, or similar, without limitation. Crucible 60 is loaded at the bottom with SiC source material 61, e.g., as-synthesized polycrystalline SiC grain with a particle size, desirably, between 0.1 and 2 mm. A SiC seed crystal 63 is disposed at the top of crucible 60.

FIG. 6 shows a non-limiting embodiment of the invention, wherein crucible 60 is loaded at the bottom with SiC source material 61. It is envisioned, however, that SiC source material 61 can be disposed alternatively in crucible 60, such as, without limitation, spaced at a distance from the bottom of crucible 60 or at a distance from the walls of crucible 60.

A separation plate 66 is prepared, which is chemically inert to the vapors 64 generated by sublimation of SiC source material 61. The thickness of plate 66 is, desirably, between 4 and 10 mm. Plate 66 includes two concentric parts: ring member 66a and central member 66b. Ring member 66a has a substantially low permeability to the vapors generated upon SiC sublimation and is made, desirably, of high-density, small-grain, low-porosity graphite, such as grade 2020 available from Mersen USA Bay City-MI Corp. 900 Harrison Street, Bay City, Mich. 48708 or similar, without limitation.

Central member 66b is made, desirably, of a lower-density, large-grain, high-porosity graphite, such as PG-25 available from NEC-Morgan Porous Carbon and Graphite Products, 200 North Town Street, Fostoria, Ohio 44830 or similar, without limitation. In other words, ring member 66a has a first, low-porosity while central member 66b has a second, higher-porosity. Due to its porous nature with open, interconnecting pores, the material forming central member 66b is substantially permeable to the vapors generated upon SiC sublimation, such as Si, $Si_2C$ and $SiC_2$ vapors. Hence, vapors 64 created by the sublimation of SiC source material 61 will preferentially pass through central member 66b versus ring member 66a. In this regard, separation plate 66 controls the flux of sublimated source material (vapors 64) that reaches SiC seed crystal 63 and the growing SiC crystal 62. The area of the central member 66b is, desirably, between 20 and 50% of the total area of plate 66.

Chemical inertness of plate 66 can be achieved by deposition of a protective layer of refractory compound on the plate surface. Desirably, all surfaces of the plate 66 are CVD coated with a 30 to 40 micron thick layer of refractory carbide, such as, without limitation, tantalum carbide (TaC) or niobium carbide (NbC). Desirably, the CVD coating of the porous member 66b of the plate 66 does not reduce substantially its permeability to the vapors generated upon SiC sublimation.

Plate 66 is disposed within the crucible 60 between SiC source material 61 and SiC seed crystal 63, thus essentially dividing the crucible interior into source compartment 61a and growth compartment 62a. Plate 66 is disposed from SiC seed crystal 63 at a distance, desirably, between 25% and 75% of the seed diameter.

Figure 3:
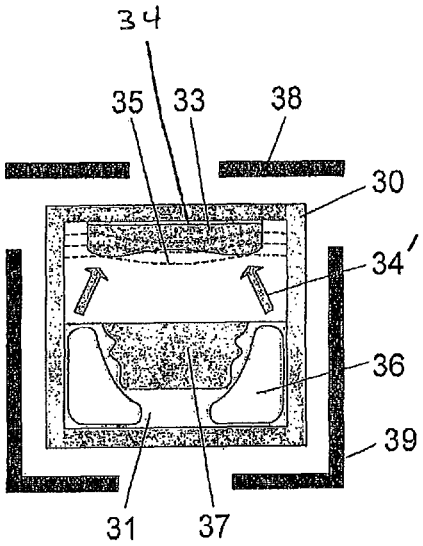
Fig. 3 (Prior Art)
FIG. 3 is a cross-sectional schematic view of the prior art SiC sublimation growth cell of FIG. 2A showing isotherms and a contour of a 150 mm diameter SiC boule obtained by finite element simulation.
Figure 4A:
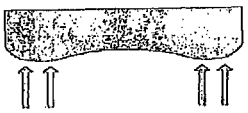
FIGS. 4A-4B are isolated views of grown SiC crystals illustrating the effect of vapor feeding on the growth interface shape obtained by finite element simulation.
Figure 4B:
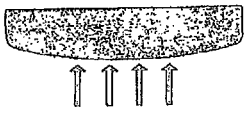

Crucible 60, loaded with SiC source material 61, separation plate 66 and SiC seed crystal 63, is placed in a crystal growth chamber (not shown), inside a two-zone resistive heating assembly that includes heaters 48 and 49 similar to heaters 38 and 39 in FIG. 3. The heating assembly of FIG. 6 is capable of controlling temperature gradients in the crucible 60 by providing for substantially shallow and positive temperature gradients in the growing SiC crystal 62 and its environs, said gradients, desirably, below 10° C./cm.

The temperature distribution inside crucible 60 can be assessed using finite element modeling. The configuration of top and bottom heaters 48 and 49 and the current flowing across said heaters are optimized to ensure that the radial temperature gradients in the crystal and its vicinity are positive and substantially shallow, said temperature gradients are desirably below 10K/cm.

Figure 1:
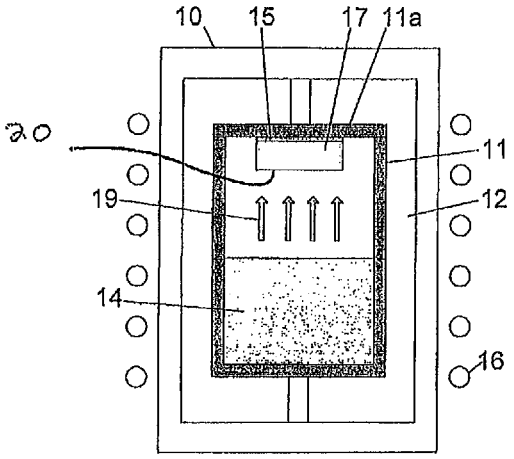
Fig. 1 (Prior Art)
FIG. 1 is a cross-sectional schematic view of a prior art SiC sublimation growth cell.
Figure 2A:
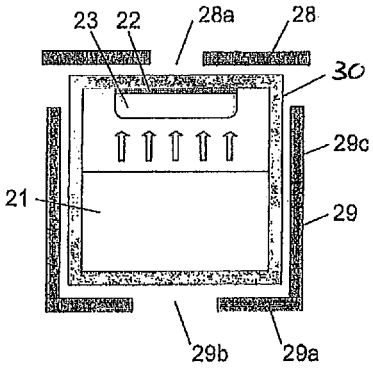
Fig. 2A (Prior Art)
FIGS. 2A-2B are cross-sectional schematic views of prior art SiC sublimation growth cells, each of which includes prior art top and bottom heaters for avoiding radial temperature gradients during SiC sublimation growth.
Figure 2B:
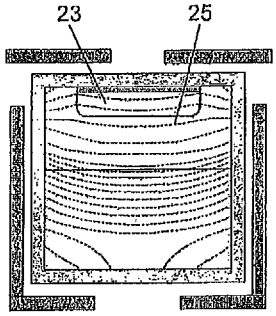
Fig. 2B (Prior Art)

In preparation for growth, the chamber in which crucible 60 is disposed, e.g., chamber 10 in FIG. 1, is evacuated and flushed with pure inert gas to eliminate traces of atmospheric gases and moisture. The material forming crucible 60 is essentially transparent to atmospheric air and inert gas, but is not as transparent to the Si- and C-bearing vapor species generated by the sublimation of SiC source material 61.

Next, heaters 48 and 49 are activated to raise the crucible temperature, desirably, between 2000° C. and 2400° C. The pressure of inert gas in the chamber is controlled to reach, desirably, between several and 100 Torr. The power levels in the top and bottom heaters 48 and 49 are controlled such that the temperature at the bottom of crucible 60 is higher than the temperature at the top, resulting in an axial temperature gradient, desirably, between 10 and 30 K/cm.

In response to raising the crucible temperature to between 2000° C. and 2400° C., the as-synthesized SiC source material 61 vaporizes and fills the source compartment 61a with Si- and C-bearing vapor species 64, such as Si, $Si_2C$ and $SiC_2$, that migrate towards plate 66 and precipitate on said plate 66 to form a dense polycrystalline SiC body 65. Desirably, full re-sublimation of the as-synthesized source 61 into the SiC body 65 is accomplished during initial stages of growth, approximately, the first 24 to 36 hours of growth.

The dense polycrystalline SiC body 65 also vaporizes, with the vapors originating from said SiC body 65 filtering across the central, vapor-permeable member 66b of plate 66 and moving towards the SiC seed crystal 63, as shown by arrows 67. Due to the fact that the vapor-permeable member 66b of plate 66 occupies between 20 and 50% of the total area of plate 66, the vapor flux approaches the SiC seed crystal 63 predominantly at the central area of said SiC seed crystal 63, said area equal approximately to 30 to 60% of the total area of SiC seed crystal 63.

Upon reaching SiC seed crystal 63, the vapors 67 precipitate on said SiC seed crystal 63 causing growth of SiC single crystal 62 on the seed 63. In the conditions of substantially shallow and positive radial gradients, this control of the vapor flux by restricting it to the central area of the growing crystal leads to a flat or slightly convex growth interface. Simultaneously, filtration of the vapors originating from the SiC body 65 across permeable member 66b leads to elimination or dramatic reduction of the number of carbon particles 64a reaching the growing crystal 62.

In-situ synthesis of silicon carbide is an optional step. A mixture of elemental carbon and silicon is prepared and disposed (in place of premixed SiC source material 61) in crucible 60 under separation plate 66. Carbon is, desirably, in the form of powder, while silicon is, desirably, in the form of lumps, desirably, of 2 to 8 mm in size. The atomic composition of the mixture is non-stoichiometric with the carbon content, desirably, between 55 and 70 atomic percent.

The chamber in which crucible 60 is disposed, e.g., chamber 10 in FIG. 1, is evacuated and filled with inert gas to a pressure desirably, between 200 and 700 Torr, which is above the normal pressure of SiC sublimation growth. Then, heaters 48 and 49 are activated and the temperature of the crucible 60 is raised to reach a temperature desirably, between 1700° C. and 1800° C. which is below the normal temperature of SiC sublimation growth. The crucible is soaked at this temperature and this pressure, desirably, for 2 to 6 hours. During this soak time, silicon and carbon react to form SiC source material 61 in-situ. The elevated pressure of inert gas minimizes vapor effluence from the reacting mixture, as well as evaporative losses of silicon from the crucible, while separation plate 66 prevents particulates generated during synthesis from reaching and contaminating the surface of seed 63. The excess of carbon in the mixture prevents molten silicon from damaging the walls of graphite crucible 60.

After in-situ synthesis of SiC is accomplished, the temperature and pressure in the system are brought to the normal values of SiC sublimation growth (discussed above), and the growth of SiC single crystal 62 on SiC single crystal seed 63 is carried out as described above.

Figure 7:
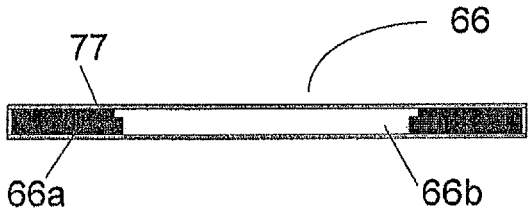
FIG. 7 is an isolated view of the separation plate shown in FIG. 6.

A non-limiting embodiment of separation plate 66 is shown in FIG. 7. The plate is, desirably, 4 to 10 mm thick and includes two concentric parts: ring member 66a and central member 66b. Ring member 66a is made of dense graphite, such as grade 2020 available from Mersen USA Bay City-MI Corp. 900 Harrison Street, Bay City, Mich. 48708 or similar, without limitation. Central member 66b is made of porous graphite, such as grade PG-25 available from NEC-Morgan Porous Carbon and Graphite Products, 200 North Town Street, Fostoria, Ohio 44830, without limitation. Tight connection between ring member 66a and central member 66b can be achieved using high-temperature carbonaceous glue or by threading, without limitation. The area of vapor-permeable, central member 66b is, desirably between 20 and 50% of the total area of plate 66.

The entire surface of plate 66 is desirably protected against vapor erosion by high-temperature CVD coating with TaC, desirably 30 to 40 micron thick (shown as item 77 in FIG. 7). Investigation of TaC-coated plates made of PG-25 porous graphite showed that TaC infiltrated into the bulk of graphite and coated the inner walls of the pores. This infiltration improved the inertness of plate 66 to vapors 64 generated upon sublimation of SiC source material 61, while not reducing the permeability of plate 66 to vapors 64.

The thus described SiC sublimation growth process yields SiC single crystals 62 having a flat or slightly convex growth interface. The interface curvature is characterized by the difference in the boule thickness measured at the boule center and that at the diameter of the wafer to be sliced from the grown SiC single crystal. Desirably, this difference is less than 6 mm.

Permeability of Graphite to Vapors Generated During SiC Sublimation

The utility of plate 66 relies on the different permeability of dense graphite (66a) versus porous graphite (66b) to vapors 64 generated upon sublimation of SiC source material 61. To this end, permeability experiments were performed using test-membranes made of dense, fine-grain, graphite 2020 available from Mersen USA Bay City-MI Corp. 900 Harrison Street, Bay City, Mich. 48708 (hereinafter "2020 graphite") and porous graphite PG-25 available from NEC-Morgan Porous Carbon and Graphite Products, 200 North Town Street, Fostoria, Ohio 44830 (hereinafter "PG-25 graphite"). The test-membranes were shaped as discs of 150 mm in diameter and 6 mm thick. Some test-membranes were CVD coated with 30 to 40 microns thick coating of TaC. A graphite crucible, similar to crucible 60 in FIG. 6, was prepared and loaded with SiC source material 61 at the bottom. A 3 mm thick pre-weighed graphite plate (hereafter "seed plate") was attached to the top of the crucible instead of the SiC seed crystal. The test-membranes were placed in the crucible at a distance of 50 mm from the seed plate. The permeability tests were carried out at a temperature of 2200° C. and argon pressure of 10 Torr. The test duration was 24 hours.

During testing, vapors from the SiC source condensed on the test-membrane forming a dense body or slug of polycrystalline SiC. The SiC slug vaporized and the vapors originating from said SiC slug filtered across the test-membrane and precipitated on the seed plate to form a dense polycrystalline SiC deposit. After test, the weight of the deposit was calculated as a difference in the weight of the seed plate before and after the experiment. The results are shown in Table 1.

TABLE 1

Results of vapor permeability tests for dense and porous graphite

| Graphite grade of membrane | Total mass transport across membrane, g |
|---|---|
| Dense 2020 uncoated | 2 |
| Dense 2020 coated with TaC | 0.5 |
| Porous PG-25 uncoated | 100 |
| Porous PG-25 coated with TaC | 110 |

The data in Table 1 shows that mass transport across the membranes made of dense 2020 graphite was about 50 times less than across membranes made of porous PG-25 graphite. TaC coating on the dense 2020 graphite further reduced its permeability. This was due to the fact that the pore sizes of dense graphite are on the order of several microns, and the 30-40 micron coating of TaC further seals the graphite surface. A similar TaC coating on porous PG-25 graphite did not, however, cause a reduction in its permeability. Rather, the TaC coating increased the permeability of the PG-25 graphite. The pore sizes of this PG-25 graphite grade are large, on the order of 100 microns, whereupon the 30-40 micron TaC coating was unable to seal the surface.

Examples of SiC Crystals Grown Using the Process of Invention

Plate 66 was used to grow large-diameter SiC single crystals 62 capable of yielding 100, 125 and 150 mm wafers. The grown SiC single crystals 62 included vanadium-doped semi-insulating 6H crystals, vanadium-doped semi-insulating 4H Si crystals and nitrogen-doped 4H n-type crystals. Doping with vanadium was used to produce semi-insulating SiC crystals. Prior Art for vanadium doping includes U.S. Pat. Nos. 5,611,955; 7,608,524; 8,216,369; and U.S. 2008/0190355; 2011/0303884, which are all incorporated herein by reference.

The grown SiC crystal boules exhibited a flat or slightly convex growth interface, with the difference in the boule thickness measured at the boule center and at the diameter of the wafer to be sliced from the grown SiC single crystal being below 6 mm.

The grown SiC boules were sliced into wafers of 100, 125 and 150 mm in diameter using a multi-wire diamond saw. The as-sawn wafers were lapped and polished on diamond slurries with the grit size progressively reduced from 9 to 1 micron. As a final step, the wafers were double-side polished using a process of Chemical-Mechanical Polishing (CMP). Depending on the wafer type and diameter, the final thickness of the wafers varied between 350 to 500 microns.

Crystal quality of the wafers was investigated using techniques commonly applied in SiC material characterization. First, polished wafers were viewed under crossed polarizers for overall degree of stress, uniformity and quality. Then, they were inspected by optical microscopy for the presence of carbon inclusions. The x-ray quality, including lattice curvature (ΔΩ) and reflection broadening (FWHM), was evaluated using mapping with the x-ray rocking curves (monochromatic Cu-Kα beam with the angular divergence of 10-12 arc-seconds and the incident beam area of about 1 $mm^2$). Micropipe density (MPD) and dislocation density (DD) were determined by etching in molten KOH followed by computerized mapping of the etch pits. In addition, the wafers were studied by the x-ray topography for the presence of stacking faults (SF). The results are summarized in Table 2 and testify to the quality of large-diameter SiC wafers produced using the growth process of invention.

TABLE 2

SiC wafers fabricated from crystals grown using the process of invention

| | | Wafer | | | | X-Ray Quality | | | | |
|---|---|---|---|---|---|---|---|---|---|---|
| SiC Wafer | Type | ∅ mm | Polytype Inclusions | Stress | Carbon Inclusions | ΔΩ | FWHM Arc-seconds | MPD $cm^{-2}$ | DD $cm^{-2}$ | SF |
| HO0010-12 | 6H SI | 100 | None | Low | None | 0.04° | ≤17 | 0.29 | $1 \cdot 10^4$ | None |
| HN0016-10 | 6H SI | 125 | None | Low | None | 0.03° | ≤25 | 0.78 | $1 \cdot 10^4$ | None |
| DZ0028-10 | 4H SI | 150 | None | Low | None | 0.15° | ~17 | 0.76 | $6.3 \cdot 10^3$ | None |
| HG0022-08 | 4H n-type | 150 | None | Low | None | 0.06° | ~14 | 0.12 | $5.8 \cdot 10^3$ | None |

The invention has been described with reference to exemplary embodiments. Obvious modifications and alterations will occur to those skilled in the art upon reading and understating the preceding detailed description. It is intended that the invention be construed as including all such modifications and alterations insofar as they come within the scope of the appended claims or the equivalents thereof.

The invention claimed is:

1. A method of fabricating a SiC single crystal comprising:

(a) sublimation growing a SiC single crystal on a surface of *a* seed crystal in the presence of a temperature gradient; and (b) during step (a), controlling said temperature gradient such that a radial temperature gradient in the *SiC single* crystal is positive and [substantially] shallow, and controlling a flux of SiC bearing vapors by [substantially] restricting said flux to a central area of the surface of the seed crystal *via a separation plate disposed between the seed crystal and a source of the SiC bearing vapors, wherein the separation plate includes an outer flux permeable part surrounding an inner flux permeable part that is more permeable to the flux of SiC bearing vapors than the outer flux permeable part, wherein the central area of the surface of the seed crystal is between 30% and 60% of a total surface area of the seed crystal around a center of the seed crystal, wherein a ratio of mass transport of the SiC bearing vapors through 1 $cm^2$ of area of the inner part of the separation plate versus the mass transport of the SiC bearing vapors through 1 $cm^2$ of area of the outer part of the separation plate is no less than 50/1.*

[2. The method of claim 1, wherein the central area of the surface of the seed crystal is between 30% and 60% of a total surface area of the seed crystal substantially around a center of the seed crystal.]

[3. The method of claim 1, wherein step (b) includes restricting the flux of SiC bearing vapors to the central area of the surface of the seed crystal via a separation plate disposed between the seed crystal and a source of the SiC bearing vapors.]

4. The method of claim [3] *1*, wherein:

the separation plate is spaced *from the seed crystal at a distance* between [about] 25% and 75% of [the seed] *a* diameter [from] *of* the seed crystal; and the separation plate has a thickness between [about] 4 mm and 10 mm.

5. The method of claim [3] *1*, wherein the separation plate is either not reactive to the SiC bearing vapors or includes a coating to avoid contact between the separation plate and the SiC bearing vapors.

[6. The method of claim 3, wherein the separation plate includes a first, outer part surrounding a second, inner part that is substantially more permeable to the SiC bearing vapors than the first, outer part.]

7. The method of claim [6] *1*, wherein:

[the second, inner part of the separation plate comprises between 20% and 50% of a total area of the separation plate; or]

the separation plate is made of graphite, *or* a refractory compound[, tantalum carbide, or niobium carbide; or a ratio of mass transport of the SiC bearing vapors through 1 $cm^2$ of area of the inner part of the separation plate versus the mass transport of the SiC bearing vapors through 1 $cm^2$ of area of the outer part of the separation plate is no less that about 50/1]*; and*

*the inner part of the separation plate that is more permeable to the flux of SiC bearing vapors than the outer part comprises between 20% and 50% of a total area of the separation plate.*

8. The method of claim [3] *1*, wherein the separation plate is configured to [substantially] remove particles from the flux of the SiC bearing vapors.

9. The method of claim 1, wherein step (a) further includes sublimation growing the SiC single crystal in the presence of [at least one of the following:] an isotherm that is convex in a direction facing [a] *the* source of the SiC bearing vapors[; and?]*, and* a radial temperature gradient of no more than [about] 10 K/cm.

10. The method of claim 9, wherein a difference in thickness between a center of the SiC single crystal and a diameter of the SiC single crystal in a growth direction of the SiC single crystal is no more than [about] 6 mm.

11. The method of claim 1, further including slicing from the grown SiC single crystal a wafer having [one or more of] the following:

a combined area of stacking faults no more than [about] 5%, 2%, or 1% of a total area of the wafer; [or] *and* a lattice curvature of no more than [about] 0.2°, 0.1°, or 0.06°, over the total area of the wafer; [or] *and* a full width at half maximum (FWHM) x-ray reflection of no more than [about] 50, 30, or 20 arc-seconds over the total area of the wafer; [or] *and* a wafer-average micropipe density (MPD) of no more than [about 1/$cm^2$] *1* $cm^{-2}$, 0.2[/$cm^2$] $cm^{-2}$, or 0.1[/$cm^2$] $cm^{-2}$; [or] *and* a wafer-average dislocation density of no more than [about] 10,000 $cm^{-2}$, 5,000 $cm^{-2}$, or 1,000 $cm^{-2}$.

12. The method of claim 1, wherein the grown SiC single crystal has a diameter [between about 100 mm and 200 mm] *sufficient for slicing wafers of 100, 125, 150 or 200 mm in diameter.*

13. The method of claim 1, further including slicing from the grown SiC single crystal a wafer having [one or more of] the following:

a wafer-average micropipe density no more than [about an average of 1/cm] *1* $cm^{-2}$; [or] *and* a percentage of micropipe-free 2 *mm*×2 mm square dies extracted from the wafer of not less than [about] 95%; [or] *and* a percentage of micropipe-free 5 *mm*×5 mm square dies extracted from the wafer of not less than [about] 90%; [or] *and* a wafer-average density of dislocations not more than [about] $10^4$[/cm] $cm^{-2}$; [or] *and* a density of threading screw dislocations of not more than [about] 1000[/cm] $cm^{-2}$; [or] *and* a density of basal plane dislocations of not more than [about] 300 cm/$cm^3$; [or] *and* zero density of foreign polytype inclusions; [or] *and* one or more [clouds of] *wafer areas populated by* carbon inclusions of no more than [about] 5% of the total wafer area; [or] *and* edge-to-edge lattice curvature no more [that about] *than* 0.15°; [or] *and* a full width at half maximum (FWHM) x-ray reflection of no more than [about] 25 arc-seconds over the total area of the wafer.

14. A SiC sublimation crystal growth system comprising;

a growth crucible configured to be charged with SiC source material and a SiC seed crystal in spaced relation; and a separation plate separating the growth crucible into a source compartment where the SiC source material resides when the growth crucible is charged with the SiC source material and a crystallization compartment where the SiC seed crystal resides when the growth crucible is charged with the SiC seed crystal, wherein:

*the separation plate is spaced from both the SiC source material and the SiC seed crystal;* the separation plate includes a [first,] central part surrounded by [a second] *an outer* part*, wherein the central part and outer part of the separation plate are both permeable to SiC bearing vapors originating from the SiC source material during sublimation growth of a SiC crystal on the SiC seed crystal;*

[that] *the central part of the separation plate has a higher permeability to the SiC bearing vapors originating from the SiC source material during sublimation growth of the SiC crystal on the SiC seed crystal than the outer part;*

*the outer part of the separation plate* has a lower permeability to *the* SiC bearing vapors originating from the SiC source material during sublimation growth of [a] *the* SiC crystal on the SiC seed crystal than the [first,] central part; [and]

*the central part of the separation plate has an area between 20% and 50% of the total area of the separation plate;*

*the separation plate is configured to restrict a flux of the SiC bearing vapors to a central area of the surface of the SiC seed crystal that is between 30% and 60% of a total surface area of the SiC seed crystal around a center of the SiC seed crystal; and* a ratio of mass transport of the SiC bearing vapors through the [inner] *central* part of the separation plate versus mass transport of the SiC bearing vapors through the outer part of the separation plate is no less [that about] *than* 50/1.

15. The system of claim 14, wherein the separation plate is made from at least one of the following: graphite, *or* a refractory compound[, tantalum carbide, or niobium carbide].

16. The system of claim 14, wherein the separation plate is spaced from the SiC seed crystal at a distance between [about] 20 mm and 70 mm.

17. The system of claim 14, wherein the separation plate includes a coating of tantalum carbide, or niobium carbide, and the coating has a thickness between [about] 20 microns to 40 microns.

18. The system of claim 14, wherein the [first,] central part of the separation plate includes passages, each of which has a maximum diameter between [about] 0.1 mm and 1 mm.

19. A method of forming a high-quality SiC single crystal wafer comprising:

sublimation growing on a SiC single crystal seed a SiC single crystal boule having a diameter sufficient for slicing wafers between 100 and 200 mm in diameter, wherein said sublimation growth occurs in the presence of controlled axial and radial temperature gradients and *a* controlled flux of sublimated source material *that is restricted, via a separation plate that is spaced from the source material and the SiC single crystal seed, to a central area of a surface of the SiC single crystal seed that is between 30% and 60% of a total surface area of the SiC single crystal seed around a center of the SiC single crystal seed, wherein the separation plate includes an outer flux permeable part surrounding an inner flux permeable part that is more permeable to the flux of sublimated source material than the outer flux permeable part, wherein a ratio of mass transport of the SiC bearing vapors through 1 cm$^2$ of area of the inner part of the separation plate versus the mass transport of the SiC bearing vapors through 1 cm$^2$ of area of the outer part of the separation plate is no less than 50/1*; and slicing from said SiC *single crystal* boule a SiC *single crystal* wafer having:

a diameter between 100 and 200 mm [inclusive]; *and* a lattice curvature of no more than [about] 0.2°, 0.1°, or 0.06° over the total area of the wafer; and a full width at half maximum (FWHM) of [the] x-ray reflection of no more than [about] 50, 30, or 20 arc-seconds over the total area of the wafer.

20. The method of claim 19, wherein the SiC *single crystal* wafer further includes a combined area of stacking faults no more than [about] 5%, 2%, or 1% of a total area of the *SiC single crystal* wafer.

21. The method of claim 19, wherein the SiC *single crystal* wafer further includes [at least one of] the following:

a wafer-average micropipe density (MPD) of no more than [about] 1 cm$^{-2}$, 0.2 cm$^{-2}$, or 0.1 cm$^{-2}$; [or] *and* a wafer-average dislocation density of no more than [about] 10,000 cm$^{-2}$, 5,000 cm$^{-2}$, or 1,000 cm$^{-2}$.

22. A method of forming a high-quality SiC single crystal wafer comprising:

sublimation growing on a SiC single crystal seed a SiC single crystal boule having a diameter sufficient for slicing wafers between 100 and 200 mm in diameter, wherein said sublimation growth occurs in the presence of controlled axial and radial temperature gradients and *a* controlled flux of sublimated source material *that is restricted, via a separation plate that is spaced from the source material, to a central area of the surface of the SiC single crystal seed that is between 30% and 60% of a total surface area of the SiC single crystal seed around a center of the SiC single crystal seed, wherein the separation plate includes an outer flux permeable part surrounding an inner flux permeable part that is more permeable to the flux of sublimated source material than the outer flux permeable part, wherein a ratio of mass transport of the SiC bearing vapors through 1 cm$^2$ of area of the inner part of the separation plate versus the mass transport of the SiC bearing vapors through 1 cm$^2$ of area of the outer part of the separation plate is no less than 50/1*; and slicing from said SiC *single crystal* boule a SiC *single crystal* wafer having a combined area of stacking faults no more than [about] 5%, 2%, or 1% of a total area of the *SiC single crystal* wafer.

23. The method of claim 22, wherein the SiC *single crystal* wafer further includes: a lattice curvature of no more than [about] 0.2°, 0.1°, or 0.06° over the total area of the *SiC single crystal* wafer.

24. The method of claim 22, wherein the SiC *single crystal* wafer further includes a full width at half maximum (FWHM) of [the] x-ray reflection of no more than [about] 50, 30, or 20 arc-seconds over the total area of the *SiC single crystal* wafer.

25. The method of claim 22, wherein the SiC *single crystal* wafer further includes [at least one of] the following:

a wafer-average micropipe density (MPD) of no more than [about] 1 cm$^{-2}$, 0.2 cm$^{-2}$, or 0.1 cm$^{-2}$; [or] *and* a wafer-average dislocation density of no more than [about] 10,000 cm$^{-2}$, 5,000 cm$^{-2}$, or 1,000 cm$^{-2}$.

[26. A high-quality SiC single crystal wafer having a diameter between 100 and 200 mm and comprising at least one of the following:

a lattice curvature of no more than about 0.2°, 0.1°, or 0.06° over the total area of the wafer; or a full width at half maximum (FWHM) of the x-ray reflection of no more than about 50, 30, or 20 arc-seconds over the total area of the wafer; or a combined area of stacking faults no more than about 5%, 2%, or 1% of a total area of the wafer.]

[27. The SiC single crystal of claim 26, wherein the crystal comprises either a 4H polytype or a 6H polytype.]

* * * * *